(12) United States Patent
Thewes et al.

(10) Patent No.: US 7,944,725 B2
(45) Date of Patent: May 17, 2011

(54) SEMICONDUCTOR MEMORY AND METHOD FOR OPERATING A SEMICONDUCTOR MEMORY

(75) Inventors: Roland Thewes, Groebenzell (DE); Michael Otto, Dresden (DE); Helmut Schneider, Munich (DE)

(73) Assignee: Qimonda AG, Munich (DE)

( * ) Notice: Subject to any disclaimer, the term of this patent is extended or adjusted under 35 U.S.C. 154(b) by 327 days.

(21) Appl. No.: 12/125,684

(22) Filed: May 22, 2008

(65) Prior Publication Data

US 2009/0285006 A1 Nov. 19, 2009

(30) Foreign Application Priority Data

May 22, 2007 (DE) .......................... 10 2007 023 653

(51) Int. Cl.
*G11C 5/06* (2006.01)
(52) U.S. Cl. ............................ 365/63; 365/205; 365/190
(58) Field of Classification Search .................... 365/63, 365/205, 149, 190
See application file for complete search history.

(56) References Cited

U.S. PATENT DOCUMENTS

| 4,841,483 A | * | 6/1989 | Furuyama ................. 365/189.07 |
| 6,970,389 B2 | | 11/2005 | Proell et al. |
| 2005/0157534 A1 | * | 7/2005 | Ferrant et al. .................. 365/149 |
| 2006/0146593 A1 | * | 7/2006 | Klehn et al. .................... 365/149 |
| 2006/0158924 A1 | * | 7/2006 | Sekiguchi et al. ............. 365/149 |

FOREIGN PATENT DOCUMENTS

DE 103 01 856 A1 8/2004

OTHER PUBLICATIONS

Min, D-S., et al., "Multiple Twisted Dataline Techniques for Multigigabit DRAM's," IEEE Journal of Solid-State Circuits, vol. 34, No. 6, Jun. 1999, pp. 856-865, IEEE.

Sekiguchi, T., et al., "A Low-Impedance Open-Bitline Array for Multigigabit DRAM," IEEE Journal of Solid-State Circuits, vol. 37, No. 4, Apr. 2002, pp. 487-498, IEEE.

* cited by examiner

*Primary Examiner* — Huan Hoang
(74) *Attorney, Agent, or Firm* — John S. Economou

(57) ABSTRACT

A semiconductor memory has a plurality of read amplifiers to which a pair each of two complementary bit lines is connected, wherein the semiconductor memory includes at least one switching element each for each bit line, by which at least a partial section of the bit line may be electrically decoupled from the read amplifier, and wherein the semiconductor memory controls the first switching element so that the first switching element, when reading out and/or refreshing any memory cell connected to the bit line, temporarily electrically decouples at least the partial section of the bit line from the read amplifier.

8 Claims, 6 Drawing Sheets

FIG 3
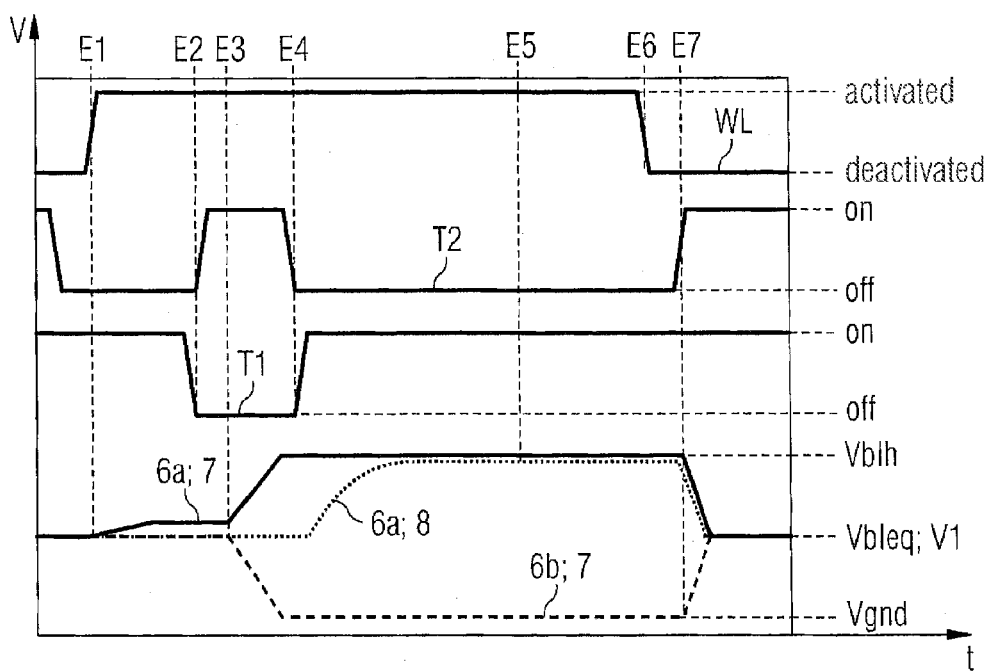
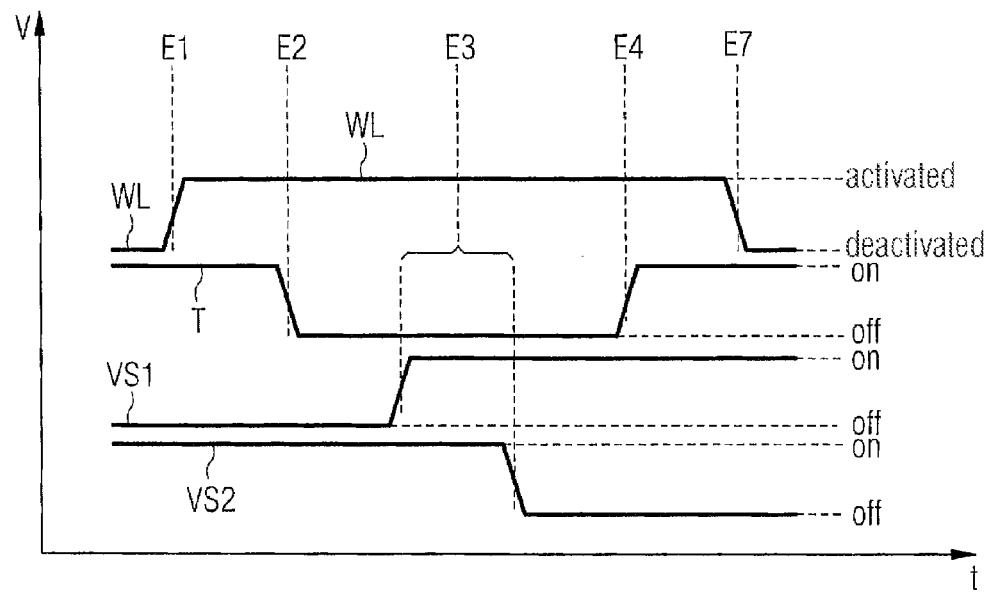

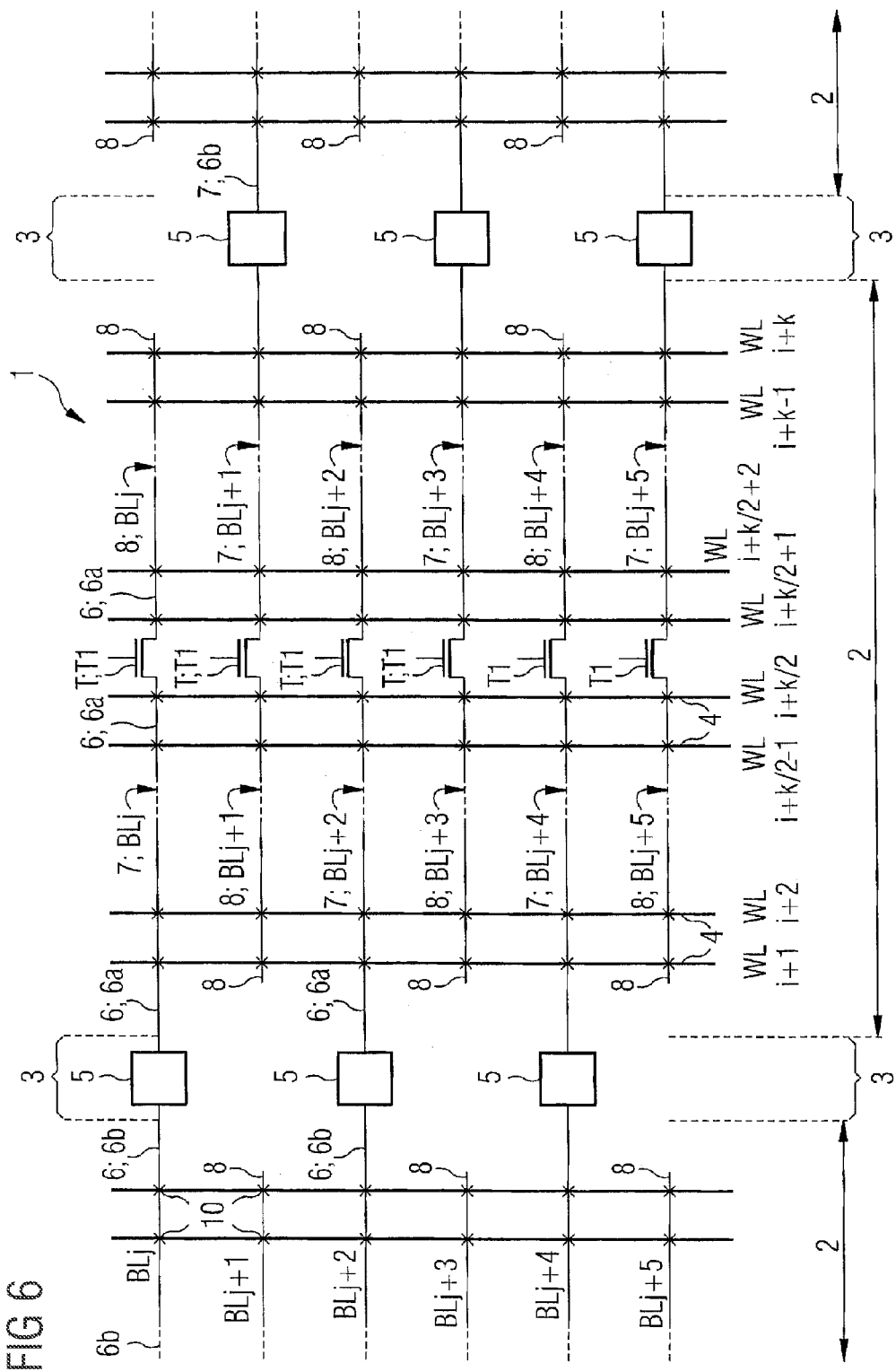

SEMICONDUCTOR MEMORY AND METHOD FOR OPERATING A SEMICONDUCTOR MEMORY

This application claims priority from German Patent Application No. 10 2007 023 653.2, which was filed on May 22, 2007, and is incorporated herein in its entirety by reference.

TECHNICAL FIELD

The invention lies in the field of integrated semiconductor memories and the operation of integrated semiconductor memories. Semiconductor memories may in particular be volatile semiconductor memories, for example, DRAMs (dynamic random access memories).

BACKGROUND

DRAMs have a plurality of memory cells which are respectively connected to bit lines, via which the stored information may be read out. The bit lines are connected to read amplifiers. In a read amplifier the potentials of two bit lines which are complementary to each other are compared when a memory cell is read out. For this purpose, with the help of the respective word line, the memory cell to be read out is opened, i.e., connected to the bit line, so that the charge stored in the memory capacitor is distributed on the bit line and slightly changes its potential. In the read amplifier the potential which is increased or decreased in this way is compared to the potential of a complementary bit line whose potential is not changed by opening a word line. The potential difference between the two bit lines (and/or the two read amplifier inputs) measured within the read amplifier is increased by the read amplifier and written back into the memory cell after the amplification. In this so-called spreading of the bit line potentials, the potential difference between both bit lines is artificially increased. After deactivating the word line a sufficiently high charge quantity is stored again in the charge capacitor. Reading out is performed inside the memory in the read amplifier. The readout result may be passed on, for example, upon an explicit readout command. The readout result may also be written back into the memory cell for refreshing the same. Likewise, a new information may be written into the memory cell, irrespective of the data bits stored and read out previously. Here, the bit line potentials are spread according to the data bit to be stored.

In DRAMs, mainly two memory area-internal constructions regarding the arrangement of bit lines are known. In the folded bit line concept, the bit lines which are complementary to each other (i.e., to be spread against each other) pass along the same direction away from the read amplifier. In this construction a readout amplifier may often be connected to any one of two pairs of bit lines, for example, via a multiplexer, wherein two complementary bit lines of the same bit line pair respectively run towards each side.

In the open bit line concept, the complementary bit lines are directed in opposite directions away from the read amplifier to which they are connected. With both constructions, groups, each having a plurality of read amplifiers, are combined into rows of read amplifiers. These rows of read amplifiers generally run in parallel to each other, and the bit lines pass in a direction perpendicular to the course of the rows of read amplifiers away from the same. In the open bit line concept, the memory cells which are connected by two complementary bit lines lie on opposite sides of one of those rows of read amplifiers from which the bit lines originate. Accordingly, both bit lines respectively cross different groups of word lines. Thus, a capacitive crosstalk to the word line opening the memory cell to be read out only occurs at the active bit line; the complementary bit line experiences no comparative capacitive crosstalk. Thereby, at the active bit line a slight potential shift results which overlays the potential shift caused by the charge of the open memory cell, which should actually be read out. While semiconductor memories according to the folded bit line concept cause an equally strong coupling at both bit lines, semiconductor memories according to the open bit line concept are advantageous anyway regarding the lower substrate area consumption due to the higher packing density of memory cells below a base area of 8F2 (with the minimum structure width F).

Apart from the potential shift due to the coupling between the word line and the bit line, in particular crosstalk processes occur which are far more difficult to control which also influence the potential of a bit line to be read out. Thus, apart from the potential of the respectively adjacent bit line, in particular also the potential of the semiconductor substrate, the potential of a well arranged within the substrate, the potential of a common capacitor electrode of trench capacitors (buried plate) or also the common capacitor electrode of stacked capacitors (plate) may shift the bit line potential. All of those influences may cause readout errors in the read amplifier with an unfavorable influence on the bit line potential. There is thus the need, with volatile semiconductor memories, like, for example, DRAMs, in particular those in open bit line construction, to decrease the influences of parasitic capacitive or other influences on the potential of the bit lines.

SUMMARY OF THE INVENTION

One embodiment of the invention relates to a semiconductor memory comprising a plurality of read amplifiers to which a pair each of two complementary bit lines is connected, wherein the semiconductor memory comprises at least a first switching element each for each bit line, by which at least a partial section of the bit line may be electrically decoupled from the read amplifier, and wherein the semiconductor memory controls the first switching element so that the first switching element, when reading out and/or refreshing any memory cell connected to the bit line, temporarily electrically decouples at least the partial section of the bit line from the read amplifier.

One embodiment of the invention relates to a semiconductor memory comprising a plurality of read amplifiers to which one pair each of two complementary bit lines is connected, wherein the semiconductor memory comprises one switching element each for each bit line, by which the bit line may be electrically decoupled from the read amplifier, and wherein the semiconductor memory controls the switching element so that the switching element, when reading out and/or refreshing any memory cell connected to the bit line, temporarily electrically decouples the bit line from the read amplifier.

One embodiment of the invention relates to a semiconductor memory comprising a plurality of read amplifiers, to which one pair of two complementary bit lines each is connected, wherein the semiconductor memory comprises at least a first switching element each for each bit line, by which at least a partial section of the bit line may temporarily be decoupled from the read amplifier, wherein for each bit line the first switching element is interconnected between a first bit line section which leads to the read amplifier and a second bit line section, wherein the first switching element associated with the respective bit line electrically decouples the second bit line section from the first bit line section in the blocking state and wherein the semiconductor memory further comprises a second switching element for each bit line, which is arranged at an end of the second bit line section facing away from the read amplifier.

One embodiment of the invention relates to a method for operating a semiconductor memory comprising at least one read amplifier and a pair of two complementary bit lines connected to the read amplifier and, for each bit line, at least a first switching element each, by which at least a partial section of the bit line may be electrically decoupled from the read amplifier, wherein the first switching element is controlled so that, when reading out and/or refreshing any memory cell connected to the bit line, at least the partial section of the bit line is temporarily electrically decoupled from the read amplifier.

BRIEF DESCRIPTION OF THE DRAWINGS

In the following, the invention is described with reference to the drawings, in which:

FIG. 3 shows an embodiment of a method for operating the semiconductor memory according to FIGS. 1 and 2 with an illustration of some potential processes;

FIG. 4A shows a simplified sectional enlargement from FIG. 4;

FIG. 6 shows an alternative embodiment for FIGS. 1 and 2 of an inventive semiconductor memory.

DETAILED DESCRIPTION OF ILLUSTRATIVE EMBODIMENTS

Figure 1:
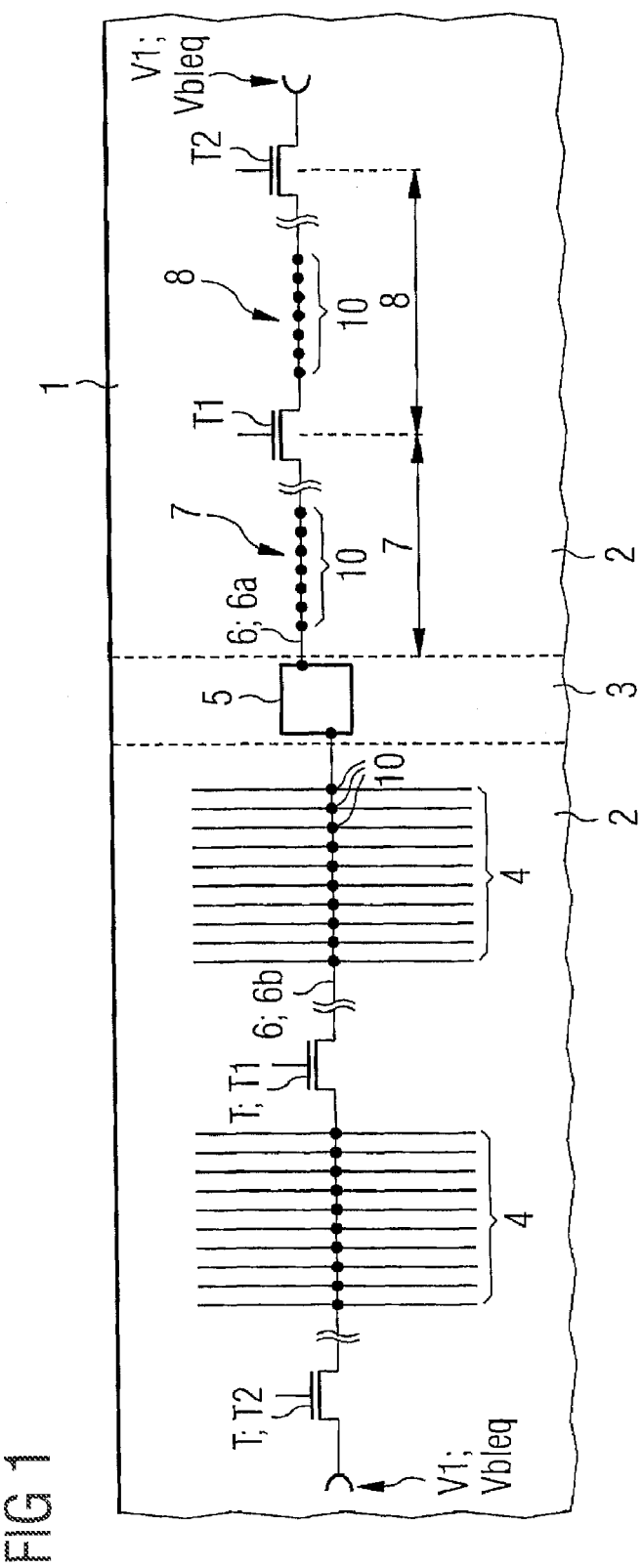
FIG. 1 shows a schematical illustration of a first embodiment of an inventive semiconductor memory.

FIG. 1 shows a schematic top view of a semiconductor memory according to a first embodiment of the invention. A section of a memory area of the semiconductor memory 1 is illustrated, wherein only one single read amplifier 5 and only one single pair of two complementary bit lines 6 are illustrated representatively. In the embodiment of FIG. 1, both bit lines 6 run away from the read amplifier 5 in opposite directions from the read amplifier 5. In FIG. 1 one bit line 6a extends originating from the read amplifier to the right-hand side, whereas the complementary bit line 6b in FIG. 1 leads away from the read amplifier to the left. The read amplifier 5 serves, when reading out a memory cell which is connected to one of the two bit lines 6a, 6b, for comparing the potentials of both bit lines 6a, 6b to each other and to amplify a determined potential difference, i.e., to spread the bit line potentials. Spreading the bit line potentials is conventionally performed directly after the so-called sensing, i.e., after detecting a change of potential occurring at the active bit line. A change of potential occurs when a memory cell is opened by the corresponding word line and the charge of the memory capacitor is distributed across the complete bit line up to the read amplifier 5.

In FIG. 1, the memory cells 10 are illustrated only schematically; in an embodiment in the form of a DRAM, the first source/drain electrode of a select transistor of a memory cell 10 will be connected to the bit line and the gate electrode of the select transistor will be connected to the word line; the second source/drain electrode goes from the select transistor to the memory capacitor which may, for example, be a trench capacitor or a stacked capacitor. Independent of the embodiment described here, also other constructions and types of semiconductor memories apart from DRAMs may be implemented in the inventive way, however.

In FIG. 1, transverse to the complementary bit line 6b, a number of word lines 4 are illustrated which cross the bit line 6b, wherein at the crossing respectively one memory cell is connected in the above-described way to the bit line 6b and the respective word line 4. In FIG. 1, only a very small section of a real memory area of a semiconductor memory is illustrated. In particular, only one single row 3 of read amplifiers 5 is indicated which is arranged in parallel to a plurality of further rows 3 of read amplifiers. Between adjacent rows 3 of read amplifiers, respectively a plurality of bit lines extend, which are connected to the read amplifiers of the respectively adjacent rows. The respective second ends of the respective bit line conventionally have no electrical connection, so that the bit lines are only connected to the read amplifier at their first end and otherwise the bit line potential is influenced by the memory cells to be opened individually.

In FIG. 1, the course of a single bit line 6a and its complementary bit line 6b is illustrated in sections.

According to the embodiment of the invention illustrated in FIG. 1, along the course of the bit lines 6 at least one switching element T1, i.e., in particular a first switching element T1, is illustrated. According to an embodiment, the first switching element T1 is arranged between two bit line sections 7, 8 of the respective bit line 6. This means that the same number of memory cells 10 is connected to the first bit line section 7 and to the second bit line section 8 of the respective bit line 6. The bit line sections 7, 8 are illustrated in FIG. 1, in particular for bit line 6a. Likewise, the complementary bit line 6b is divided into two bit line sections by an associated switching element T, like e.g., a first switching element T1. Any switching elements mentioned in the present applications may in particular be transistors, for example, MOS field-effect transistors (MOSFETs).

Conventionally it is not provided for that a bit line, when reading out a memory cell which is connected to the bit line, is temporarily electrically decoupled from the read amplifier for reading out the memory cell, or that even only a part of the bit line is electrically decoupled from the read amplifier. As the potential change of the bit line generated when opening a memory cell with the help of a word line has to be sensed at the read amplifier, the electrical charge which was previously stored in the memory capacity has to be able to flow without an interruption of the bit line up to the read amplifier, where the potential change occurring then as compared to the reference potential of the complementary bit line is sensed and amplified. Even if, in a read amplifier strip, each read amplifier may respectively be connected to one of two bit line pairs (for example, via a multiplexer) and thus at any time only activates and/or reads out one single bit line pair, only the bit lines of the currently deactivated pair, i.e., which is not connected to the read amplifier for reading out, are electrically decoupled from the read amplifier. The bit lines of the readout bit line pair, however, are and remain electrically coupled to the read amplifier during the readout process and the re-write process (wherein both with a readout command and also with a refresh command one readout process each is performed at the read amplifier and then a re-write, i.e., a refresh process, is performed).

According to the invention it is proposed, however, to provide switching elements along the bit line course (for example, like in FIG. 1 for the first switching element T1 between two bit line sections), by which at least partial sections of the bit lines may temporarily be electrically decoupled from the read amplifier, i.e., even when the bit line pair to which the respective bit line belongs is currently read out, i.e., when the read amplifier is active.

At first sight, it does not seem to be practical to arrange a switching element T1, for example, a transistor, using the section of the bit line leading outwards from the same may be electrically decoupled, between the outermost memory cell which is arranged along the respective bit line at the greatest possible distance from the read amplifier and the read amplifier. The reason for this is that the charge shift resulting when opening the outermost memory cell propagates across the overall bit line length, and thus also across the area of the bit line at which, according to this embodiment of the invention, a switching element T1 is arranged.

Advantageously, however, at the beginning of the readout process, in particular after opening the word line serving for controlling a memory cell, the first switching element T1 is still left in the conductive state in which it conductively connects both bit line sections 7, 8 to each other and balances potential differences between both bit line sections. According to the invention the fact is made use of, however, that at least when the charge shift resulting when opening the memory cell has influenced the complete bit line length, subsequently a partial section of the bit line, for example, an outer, second bit line section 8 may be electrically decoupled without corrupting the actual bit line potential at the read amplifier input. This is inventively used to decrease the effects of parasitic interference effects on the bit line potential as far as possible and, in further embodiments, to bias sections of the bit line which are no longer needed for reading out with a neutral, predetermined potential. By this, between adjacent bit lines, as will be explained below with reference to FIG. 2, crosstalk may be prevented.

After the potential change at the active bit line 6a which occurred in the so-called sensing has been detected, the bit line potentials are spread, so that on both bit lines sufficiently high and/or low potentials are present to write back the originally read-out information in an amplified way into the respective memory cell. According to the embodiment of FIG. 1, as soon as the bit line potentials at the terminals of the bit lines at the read amplifier have been spread, the respective (at least one) switching element T and/or T1 is switched to be conductive again to bias also the outermost section of the respective bit line, for example the second bit line section 8 of the active bit line 6a in FIG. 1, up to the outermost memory cell 10. Thus, according to the invention, a temporary electrical decoupling of at least one partial section of the bit line is performed which does not conflict with a readout of the memory cell independent of the position of the memory cell to be read out along the bit line.

FIG. 1 at the same time still shows a further embodiment of the present invention, in which per bit line 6 not only a first switching element T1, but also a second switching element T2 is provided. Advantageously, the second switching element T2 is arranged at the very end of the respective bit line 6a, 6b which is arranged on the side of the respective bit line facing away from the read amplifier 5. Each bit line thus runs between the read amplifier 5 and the respective second switching element T2. The second switching element T2 serves for biasing the second, outer bit line section 8 with a predetermined potential V1, for example, a precharge potential Vbleq, with a first switching element T1 which is switched to be blocking. While, conventionally, the bit line floats when it is not currently activated for reading out by the read amplifier, the second switching elements, according to the embodiment of the invention, enable actively influencing the potential of the bit lines or at least of sections of the bit lines even when the respective read amplifier 5 is deactivated. By this, crosstalk between bit lines is prevented and, in particular with the open bit line concept, the critical influence of capacitive, electric or other couplings on the potential of the respective bit line is widely defused.

Figure 2:
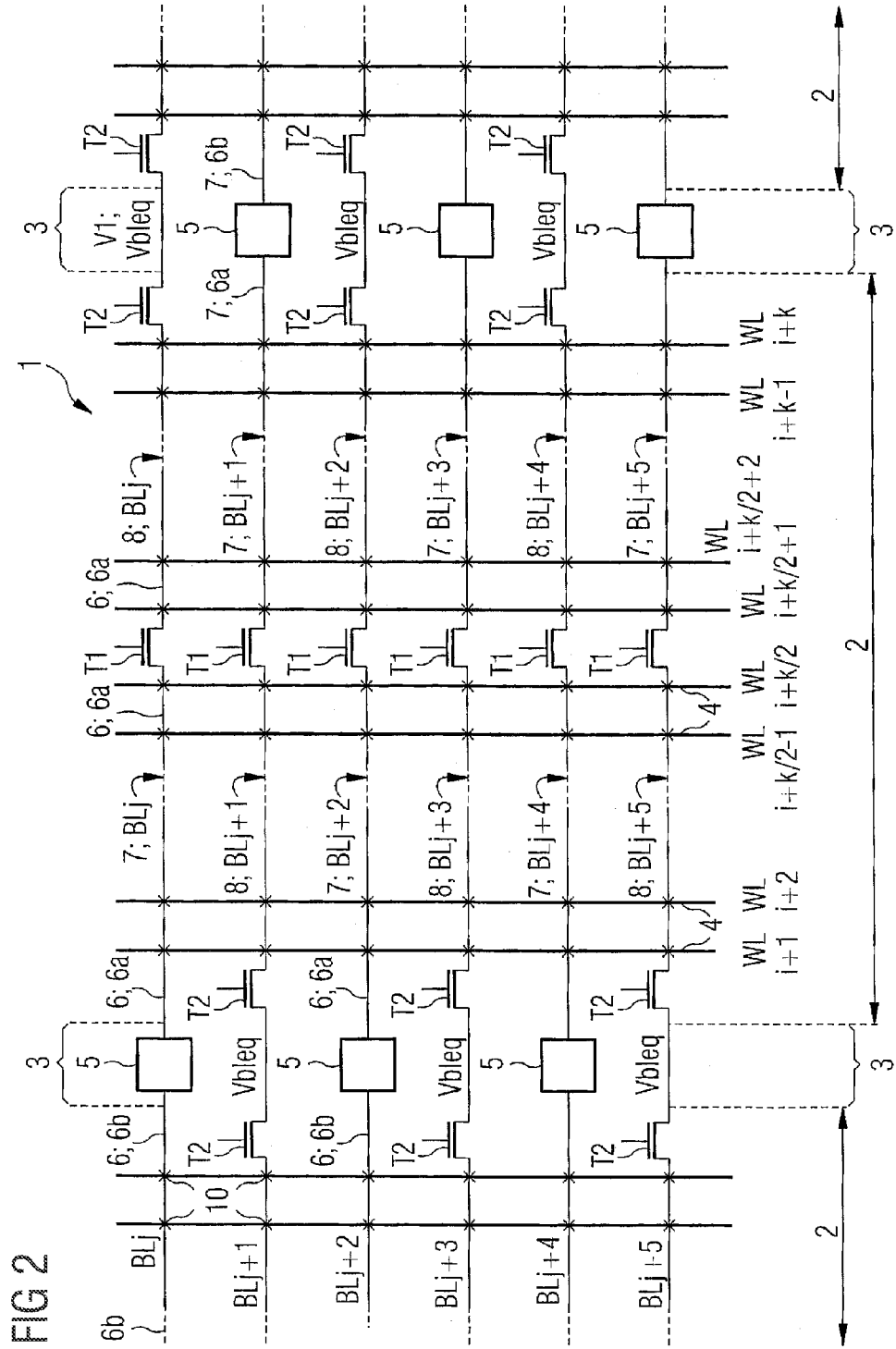
FIG. 2 shows a further schematical illustration of the semiconductor memory according to FIG. 1.

FIG. 2 shows a larger section of the semiconductor memory 1 of the embodiment of FIG. 1. Two rows 3 of read amplifiers 5 are illustrated, to which read amplifiers of two complementary bit lines 6a, 6b are connected. Between two rows 3 of read amplifiers each, a memory cell field 2 is arranged, wherein the term memory cell field 2 does not stand for the complete memory area of a semiconductor memory, neither here nor in the other embodiments, but only designates a small matrix of memory cells 10 which is connected to a group of word lines 4 and a group of bit lines 6 each which cross each other. In particular, for example, in FIG. 2, the bit lines are connected to the read amplifiers 5 and run, originating from the same, horizontally in FIG. 2. The word lines 4, however, run vertically in FIG. 2, advantageously perpendicular to the bit lines. Originating from the read amplifier 5 illustrated on the top left in FIG. 2, one bit line 6a runs to the right, whereas the complementary bit line 6b runs to the left originating from the read amplifier. The active bit line 6a crosses a group of word lines which are designated by $WL_{i+1}$ to $WL_{i+k}$ in FIG. 2. The bit line 6a thus reaches almost up to the read amplifier strips 3 illustrated on the right in FIG. 2. In the embodiment of FIG. 2, the bit line 6 is divided into two bit line sections 7, 8 by a first switching element T1, and may be connected to a first potential V1 at its outer end by a second switching element T2, wherein the voltage terminal for the potential V1 is advantageously arranged in the nearest read amplifier strip 3. The first switching element T1 enables a temporary interruption of the electrical connection between the two bit line sections 7, 8, and the second switching element T2 enables electrically biasing, for example, by a neutral potential and/or precharge potential Vbleq (which is used as a predetermined first potential V1), when the first switching element T1 is switched to be blocking.

In FIG. 2 it may be seen that between two second next adjacent bit lines, i.e., bit lines which are connected to adjacent read amplifiers 5 of a certain row 3 of read amplifiers, exactly one bit line each is arranged which is connected to a read amplifier 5 of another row 3 of read amplifiers. This has the consequence that also between directly adjacent bit lines, first bit line sections (which are arranged close to the controlling read amplifier as inner bit line sections) and second bit line sections (which are arranged far apart from the controlling read amplifier as outer bit line sections) alternate. For example for the bit line $BL_j$ illustrated at the top of FIG. 2, the first bit line section 7 is arranged directly next to the second bit line section 8 of the next bit line $BL_{j+1}$, which is connected to a read amplifier 5 of the row 3 of read amplifiers illustrated on the right in FIG. 2. Thus, a first bit line section 7 each of any bit line is surrounded by two second bit line sections 8 of the adjacent bit lines and vice versa. Thus, for example, for the bit line $BL_{j+1}$, the first bit line section 7 is surrounded by two second bit line sections 8 of the two bit lines $BL_j$ and $BL_{j+1}$. This arrangement is used according to an embodiment of the invention to electrically decouple any second bit line sections in the sensing phase and bias the same with a predetermined neutral potential or precharge potential or other first potential V1 to prevent bit line-bit line couplings. If the outer bit line sections 8 are set to a predetermined potential V1, for example, Vbleq, then the interference effects which conventionally occur when spreading the adjacent bit lines are cancelled and the bit line signals may be read out with a substantially increased reliability with regard to readout errors than conventionally.

FIG. 3 schematically shows the time course of some potentials of the semiconductor memory in the embodiment according to FIGS. 1 and 2. In particular, the electric potential V for the word line WL, using which the memory cell for reading out is opened, and the potential of sections of complementary bit lines 6a, 6b is illustrated. Further, the switching state of the first and the second switching element T1, T2 is illustrated, wherein the state "on" corresponds to a switching element which is switched to be conductive and the switching state "off" corresponds to a switching element which is switched to be blocking. The potential curves are plotted onto a time scale t and change in a characteristic way with different events E1 to E7. In FIG. 3, as an example for an access to a memory cell, a readout process and/or a refreshing process is illustrated. In both cases, first the memory content of a memory cell to be read out is read out and/or sensed in the read amplifier and then re-written in an amplified way. If an external readout command is present which is sent to the chip or sent from the chip to the signal amplifier, the readout result may also additionally be passed on to any other area of the semiconductor memory or to an external terminal. In any case, however, first the information which was previously stored in the cell has to reach the read amplifier and subsequently be written back in an amplified way into the memory cell. If the information is not written back, but instead a new, possibly different information is written into the memory cell, meanwhile between the events E5 and E6 the potentials of the two bit lines 6a, 6b may be inverted in a spread state (in the case of an opposing new data bit to be stored). For describing the functioning of the inventive semiconductor memory, only the case of a conventional readout and/or write-back process (readout and/or refresh) has to be considered.

At the beginning of the readout process, the first switching element T1 is switched to be conductive and thus conductively connects both bit line sections 7, 8 of the active bit line 6a (FIGS. 1 and 2) to each other. The word line is first in the deactivated state and is only activated at the time E1. In the inventive semiconductor memory, however, according to one embodiment, using the first and second switching elements T1, T2, the second switching element T2 is first switched to be blocking before a point of time E1 to separate the outer end of the bit line from a predetermined potential. Shortly after the point of time E1, thus the active bit line 6a is only connected to the read amplifier and the memory cell opened by the just activated word line. In the case of a digital data bit which, for example, designates a digital one, thus the bit line potential of the bit line 6a increases slightly, as illustrated below in FIG. 3 between the times E1 and E2. At the latest at the point of time E3 two slightly different potentials are present at the bit line 6a and the bit line 6b. According to the invention, before spreading the bit line potentials, which starts at the point of time E3, first the first switching element T1 is switched to be blocking and advantageously shortly afterwards but still before the point of time E3 the second switching element T2 (if present) is switched to be conductive. Switching the first switching element T1 to be blocking for a short time causes at least a transient electrical decoupling of the second bit line section 8 of the active bit line 6a from the read amplifier 5 to which the active bit line 6a is connected. This electrical decoupling is also performed when the memory cell to be read out is currently connected to the second bit line section 8 of the active bit line and thus is itself temporarily electrically decoupled from the read amplifier. As the information of the memory cell was already transferred previously to both bit line sections, correctly reading out the original cell information is still possible despite the decoupling of both bit line sections. Switching the second switching element T2 to be conductive causes the second bit line section or, more generally, the outer second bit line section 8 not and/or not yet to be spread, but first to be biased with a predetermined potential V1, advantageously the potential Vbleq. At the same time, advantageously also the outer, second bit line sections of those bit lines which are adjacent to the active bit line to be read out are biased with this potential V1. By this, a crosstalk between the bit lines is prevented as far as possible, in particular during the sensing phase approximately up to a point of time E2. As it may be seen below in FIG. 3 between the points of time E2 and E3, in this time interval the setting potential difference between the active bit line 6a and the complementary bit lines 6b is very low and thus extremely prone to parasitic influences which influence the sign of the relative potential difference between both bit lines and may possibly reverse it. By the suppression of crosstalk between the bit lines reached according to the invention, at this critical point in time up to the beginning of spreading (beginning at the point of time E3) a more reliable, less error-prone readout of the correct data bit of the memory cell is enabled. While, from the point of time E3, the potential of the first bit line section 7 of the active bit line 6a increases up to Vblh as a consequence of spreading and that of the first bit line section 7 of the complementary bit line 6b falls to Vgnd, the first switching element T1 of the active bit line 6a and advantageously also that of the complementary bit line (and advantageously also those of all further bit lines of the same memory cell field 2) remain in the blocking state. Insofar, the potential curves indicated in FIG. 3 by T1 and T2 do not only stand for the first switching element T1 and the second switching element T2 of the individual bit line 6a which is currently activated, but also at the same time for the switching state and the potential curve of the corresponding first and second switching elements of the remaining, in particular the adjacent bit lines at least within the same memory cell field between the directly adjacent rows of read amplifiers.

After the bit line potentials are spread, finally the first switching element T1 (and/or all first switching elements T1 of the same memory cell field between the two read amplifier strips; but at least the switching element T1 of the active bit line 6a) is switched to be conductive again. The switching element T1 of the complementary bit line (arranged separately in the adjacent memory cell field due to the read amplifier strip) does not have to be switched to be conductive again. Instead, the switching state of the first switching element of the complementary bit line is advantageously left unchanged, whereby the semiconductor memory may be operated in a substantially more energy-saving manner.

As far as (depending on the implementation) second switching elements T2 are provided additionally, the same are switched to be blocking again shortly in advance. By that, the outermost ends of the bit lines are electrically decoupled from the potential V1 and switching the first switching elements T1 to be conductive causes an increase and/or decrease of the potential of the second bit line sections of the respective bit line 6a, 6b to the potential of the associated first bit line section of the same bit line. This spreading of the bit line potentials may in particular take up to the point of time E5. During this time period, the read-out information is again written back into the memory cell. For this purpose it is necessary that also after switching the first switching element T1 to be conductive, the bit line still remains biased with the respective spreading potential Vblh and/or Vgnd on the sides of the read amplifier, to also charge the second bit line section and finally the memory cell which may be arranged at its outer end. Only then, for example, from the point of time E5, in the read amplifier the connection between the respective potential Vblh and/or Vgnd and the corresponding bit line 6a; 6b may be interrupted. As far as a new data bit is to be written into the memory cell, approximately at the point of time E5 or shortly afterwards the potentials of both bit lines may be inverted, depending on whether the new data bit deviates from the previously stored data bit or not. Finally, the word line is deactivated again at the point of time E6, and thus the memory cell is closed and/or electrically disconnected from the bit line. The second switching element T2 is switched to be conductive again later at a point of time E7 after deactivating the word line, in particular after the read amplifier is deactivated again. Alternatively, the second switching element may also remain switched to be blocked permanently before the point of time E1 and after the point of time E7. In this case, the second switching element is temporarily switched to be conductive only between the points of time E2 and E4 in order to switch off parasitic couplings between the bit lines in particular during the critical sensing phase.

In FIG. 3, the course of the electric potential of both bit line sections 7, 8 of the respective bit line is thus temporarily different. While the first bit line sections 7 of the active bit line 6a and the complementary bit line 6b behave like in a conventional semiconductor memory (solid and dashed lines in FIG. 3), the second bit line section 8 of the active bit line 6a (dotted line) and that of the complementary bit line 6b (second bit line section of the same not illustrated in FIG. 3) is spread only later.

The switching scheme illustrated in FIG. 3 and the potential curves are merely exemplary and designate a possible implementation of the invention. The first potential V1 for suppressing bit line-to-bit line couplings may, for example, be the precharge potential which may be exactly in the middle between the potentials Vblh and Vgnd. The embodiments described here have in common that respectively only a partial section of the bit line remains permanently coupled to the read amplifier during readout and write-back, whereas a further partial section is at least temporarily electrically decoupled from the read amplifier to reduce parasitic couplings for adjacent bit lines and/or prevent or at least mitigate passing on couplings between the active bit line and the substrate (and/or the well in the substrate) in the direction of the read amplifier. The embodiments are different mainly with regard to the position of the first switching element. Further, the subsequently described implementation makes do with only one switching element per bit line.

Figure 4:
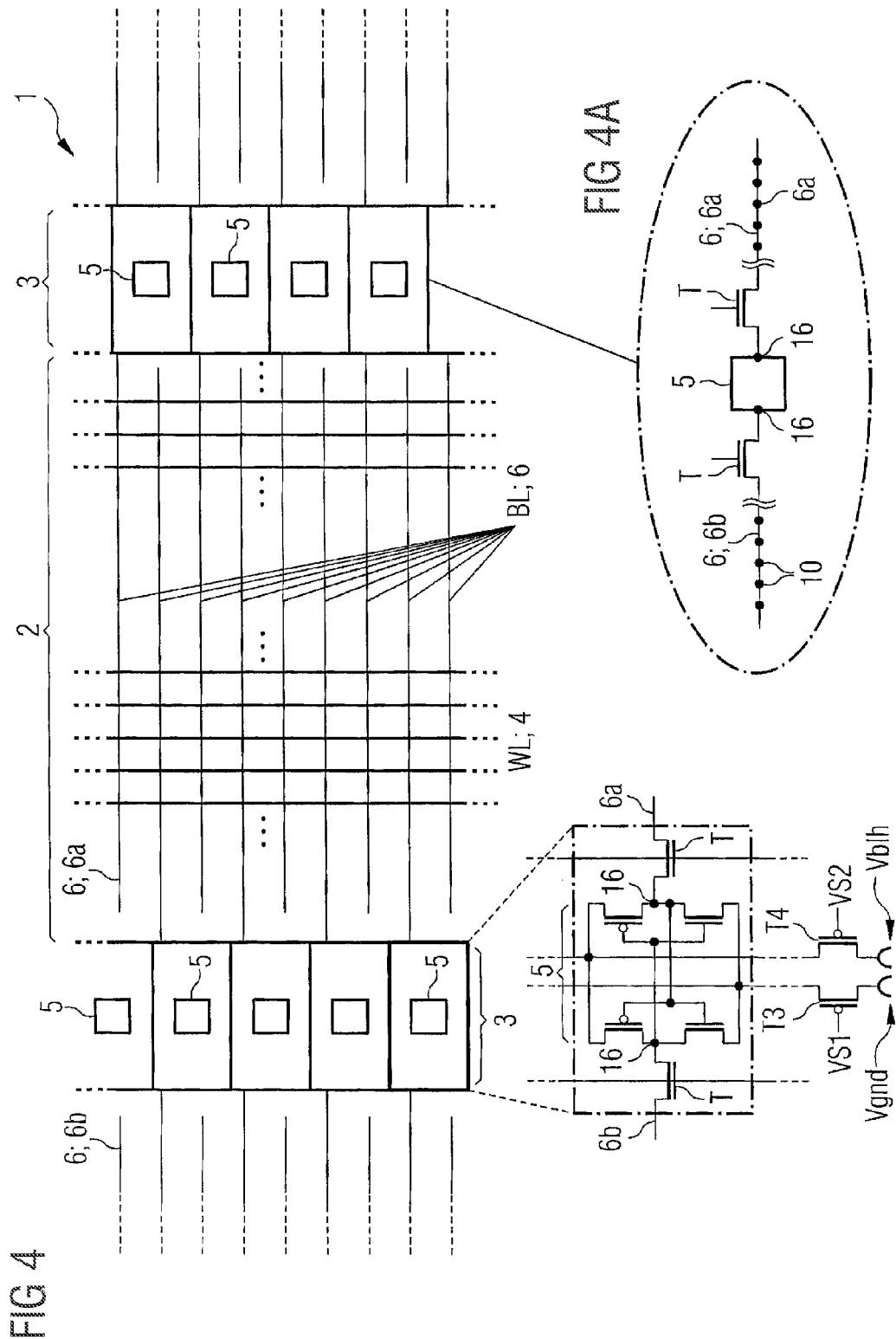
FIG. 4 shows a further embodiment of an inventive semiconductor memory.

FIG. 4 shows a further embodiment of an inventive semiconductor memory. In this implementation, the semiconductor memory 1 has bit lines 6, along the course of which only one single switching element T is arranged, whose position is further different from the position of the switching elements T1, T2 of the above-described embodiment. In FIG. 4, each bit line 6 is interrupted by a switching element T shortly before the read amplifier at its end, by which it is connected to the respective read amplifier 5. Thus, the amount of all the memory cells which may be controlled by the respective bit line 6 are, in the case of switching the switching element T to be blocking by the read amplifier 5, to which the respective bit line 6 is connected, electrically decoupled. FIG. 4 first shows a section of a memory area in which two rows 3 of read amplifiers 5 are illustrated as well as a memory cell field arranged in between the same having bit lines 6 and crossing word lines 4. From each read amplifier 5, the two complementary bit lines lead away from the read amplifier in opposite directions. The larger fields indicated in the rows 3 of read amplifiers designate space areas of the semiconductor substrate in which, in addition to the actual read amplifier 5, also the switching elements T are arranged which are provided according to this implementation of the invention. For this purpose, FIG. 4 contains a sectional enlargement which is edged in dashed lines and shows more details of the read amplifier 5. FIG. 4A additionally shows a further simplified illustration of the sectional enlargement of FIG. 4. As it may be seen in FIG. 4 in the sectional enlargement edged in dashed lines, the bit lines do not directly end at the respective space area in which the respective read amplifier is arranged, but lead across the respective switching element T to the bit line terminal of the read amplifier 5. In the sectional enlargement edged in dashed lines, the active bit line 6a is routed from the right to the read amplifier 5 via a switching element T and also the complementary bit line 6b is routed to the corresponding bit line terminal of the same read amplifier 5 via a switching element T. The internal setup of the read amplifier 5 is known per se and serves to compare and spread the two read amplifier inputs and/or bit line inputs (which are at the same time bit line outputs seen from the read amplifier). For this purpose, the read amplifier is provided with the potentials Vblh and Vgnd for spreading the bit lines. Further, control voltages VS1 and VS2 are provided, using which the respective potential Vgnd and/or Vblh for activating the read amplifier is applied via control transistors T3, T4. In this embodiment, however, the switching elements T arranged between the read amplifier 5 and the main bit line section of the respective bit line 6a, 6b are substantial. Using the same, after the respective word line has been activated and the charge of the memory capacitor propagated across the complete bit line length up to the read amplifier 5, the bit line section of the active bit line 6a (and the corresponding section of the complementary bit line 6b) arranged in the memory cell field 2 may be electrically decoupled from the respective bit line input at the read amplifier 5. Thus, not only bit line-to-bit line couplings are put out of action during the sensing phase, but at the same time also further parasitic couplings of the respective bit line to the substrate and/or to the well or the capacitor plate or other couplings occurring along the bit line course. Thus, almost the complete bit line length is temporarily, i.e., transiently, decoupled from the read amplifier, which is at least the area to which the memory cells which may be controlled by the bit line are connected. According to the embodiment of FIG. 4, at the opposite end of the respective bit line 6 no further switching element is provided, so that the bit line, when the switching element T is switched to be blocking, may basically be floating. This has, however, no disadvantageous influence on the readout result, as the switching elements T electrically decouple the section of the bit line connected to the bit line input from the main part of the bit line length.

FIG. 4A shows a schematically clearer illustration of the sectional enlargement edged in dashed lines from FIG. 4. The overall read amplifier is illustrated, to which the complementary bit lines 6a, 6b are respectively connected via a switching element T; T1 provided according to the invention. Between the switching element T and the read amplifier 5 no more memory cells 10 are arranged, in contrast to the embodiment of FIGS. 1 to 3. Instead, any memory cells 10 of the respective bit line are located at the very bit line section which may be electrically decoupled with the help of the switching element T (advantageously an MOSFET).

Figure 5:
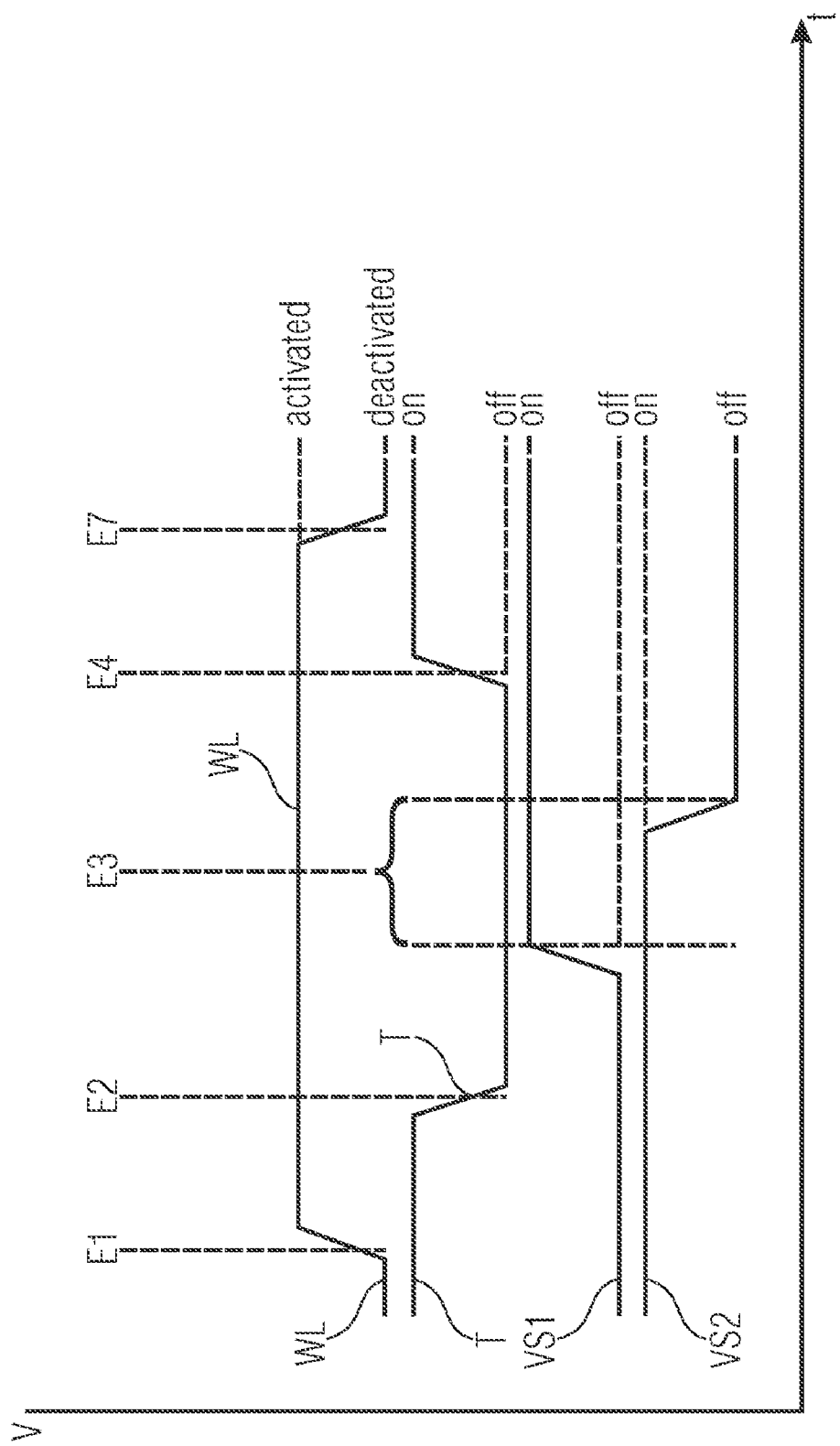
FIG. 5 shows an embodiment of a method for operating the semiconductor memory according to FIGS. 4 and 4A including an illustration of some potential processes.

FIG. 5 schematically shows the temporal course of some control signals in the operation of the semiconductor memory according to the embodiment of FIG. 4. First, at a time E1 the word line is activated, whereby the respective memory cell to be read out is opened. Before spreading the potentials of the complementary bit lines, however, the transistor and/or the switching element T provided according to an embodiment of the invention is switched from the previously conductive state into the blocking state. Thereby, the largest part of the bit line is electrically decoupled from the end of the bit line arranged at the bit line input of the read amplifier, so that now the potential of the bit line section leading to the read amplifier 5 is no longer influenced by interference effects in the memory cell field 2. The sensing phase thus begins at the time E1 and ends approximately at the time E2.

Spreading the bit line potentials of both bit lines 6a, 6b may conventionally be performed with the help of two control voltages VS1 and VS1, as illustrated in FIG. 4, which bring the lower bit line potential Vgnd corresponding to a digital zero and the upper bit line potential Vblh corresponding to a digital one to the read amplifiers. After spreading the bit line potentials, i.e., after decreasing the second control voltage VS2, the two bit lines are spread, however only in the bit line section directly between the bit line input 16 of the respective bit line (FIG. 4) and the switching element T. Now, the switching elements T are switched to be conductive again, as indicated in FIG. 5 at the point of time E4. Thus, the respective spread potential propagates across the complete bit line.

As during the sensing phase or at least at the end of the sensing phase parasitic couplings due to the switching elements T which were temporarily switched to be blocking could have no effect on the bit line inputs 16 (at the same time bit line outputs seen from read amplifier 5), the readout result written back into the memory cell now corresponds to the actual value which was stored before with a higher reliability than conventionally.

Finally, at the point of time E7 the word line is deactivated again. The implementation described with reference to FIGS. 4, 4A and 5 necessitates less switching processes and time leads for reading out a memory cell.

FIG. 6 shows an alternative embodiment of an inventive semiconductor memory with regard to FIGS. 1 and 2, illustrated in the same way as the semiconductor memory of FIG. 2. In contrast to FIG. 2, however, no second switching elements are present, but the outer bit line sections 8 have an open outer end in contrast to the first switching elements T; T1. Thus, the electric terminals for biasing the outer bit line sections 8 with a neutral potential Vbleq from their outer ends are omitted.

Just like in the remaining figures and the other embodiments described in this application, in FIG. 6 the (first) switching elements T; T1 may be arranged at any position along the bit lines. The switching elements T; T1 divide the respective bit line into a first and a second bit line section. According to a possible implementation of FIG. 6 (and also the other figures and the other embodiments described in this application) the respective switching element T; T1 may be arranged exactly in the middle of the bit lines and thus divide the bit line into a first bit line half 7 and a second bit line half 8. An equal number of memory cells are then connected to the two bit line halves.

Despite the symmetrical arrangement of the first and/or first and second switching elements with reference to the complementary bit lines on both sides of a read amplifier strip in FIGS. 1, 2, 4 and 6, it is not necessarily necessitated that switching elements arranged along the complementary bit line at any time have to be switched simultaneously with the switching elements arranged along the true bit line (i.e., the bit line to be evaluated or already evaluated). Instead, depending on the switching time and the switching process to be performed, only the switching element along the true bit line may be switched, but not the switching element along the complementary bit line. By this, a substantial energy saving results, as the complementary bit lines or their bit line sections are then reloaded less frequently. For example when, according to FIGS. 3 and 5 (at the point of time E4), the switching element T and/or the first switching element T1 is switched to be conductive again, the switching element of the complementary bit line may further remain switched to be blocking.

The embodiments disclosed in this application are only exemplary. Further embodiments result in the application of knowledge and capabilities of a person skilled in the art.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A semiconductor memory comprising:
 a plurality of read amplifiers;
 a plurality of pairs of complementary bit lines, each bit line of each pair of complementary bit lines having a first end connected to an associated one of the plurality of read amplifiers and a second end;
 a plurality of binary state memory cells coupled to each of the bit lines; and
 a plurality of first switching elements, each first switching element coupled to an associated bit line such that at least a first part of the associated bit line is selectively electrically decoupled from the associated read amplifier when reading and/or refreshing a selected binary state memory cell coupled to the associated bit line while a second part of the associated bit line remains electrically coupled to the associated read amplifier, wherein a first non-zero portion of the plurality of binary state memory cells is coupled the first part of the associated bit line and wherein a second non-zero portion of the plurality of binary state memory cells is coupled to the second part of the associated bit line.

2. The semiconductor memory of claim 1, further comprising:
 a plurality of voltage references; and
 a plurality of second switching elements coupled between an associated bit line at the second end thereof and the associated voltage reference for selectively coupling and uncoupling the associated bit line to the voltage reference.

3. The semiconductor memory of claim 2, wherein the plurality of read amplifiers and the plurality of voltage references are arranged to form two columns of alternating read amplifiers and voltage references, and wherein the plurality of bit lines are arranged in rows coupled to the two columns such that adjacent bit lines are connected to the associated read amplifier and associated voltage reference at opposite ends thereof.

4. A semiconductor memory comprising:
 a plurality of read amplifiers;
 a plurality of pairs of complementary bit lines, each bit line of each pair of complementary bit lines having a first end connected to an associated one of the plurality of read amplifiers and a second end;
 a plurality of binary state memory cells coupled to each of the bit lines;

a plurality of first switching elements, each first switching element coupled to an associated bit line such that at least a part of the associated bit line is selectively electrically decoupled from the associated read amplifier when reading and/or refreshing a selected binary state memory cell coupled to the associated bit line; and wherein a first half of the plurality of binary state memory cells are coupled to the associated bit line between the first end thereof and the associated first switching element and a second half of the plurality of binary state memory cells are coupled to the associated bit line between the second end thereof and the associated first switching element.

5. The semiconductor memory of claim 4, further comprising:

a plurality of voltage references; and a plurality of second switching elements coupled between an associated bit line at the second end thereof and the associated voltage reference for selectively coupling and uncoupling the associated bit line to the voltage reference.

6. The semiconductor memory of claim 5, wherein the plurality of read amplifiers and the plurality of voltage references are arranged to form two columns of alternating read amplifiers and voltage references, and wherein the plurality of bit lines are arranged in rows coupled to the two columns such that adjacent bit lines are connected to the associated read amplifier and associated voltage reference at opposite ends thereof.

7. The semiconductor memory of claim 4, wherein the second end of each bit line is open.

8. A semiconductor memory comprising:

a plurality of read amplifiers;

a plurality of pairs of complementary bit lines, each bit line of each pair of complementary bit lines having a first end connected to an associated one of the plurality of read amplifiers and a second end;

a plurality of binary state memory cells coupled to each of the bit lines;

a plurality of first switching elements, each first switching element coupled to an associated bit line such that at least a part of the associated bit line is selectively electrically decoupled from the associated read amplifier when reading and/or refreshing a selected binary state memory cell coupled to the associated bit line; and wherein, for each pair of the plurality of pairs of complementary bit lines, one of the complementary bit lines is directed in a first direction away from the associated read amplifier and the other of the complementary bit lines is directed in a second direction away from the associated read amplifier, opposite from the first direction.

* * * * *